United States Patent [19]

Wilson, Jr.

[11] 4,254,443
[45] Mar. 3, 1981

[54] INPUT SURGE PROTECTION FOR CONVERTER CIRCUIT

[75] Inventor: Thomas G. Wilson, Jr., Morristown, N.J.

[73] Assignee: Bell Telephone Laboratories, Incorporated, Murray Hill, N.J.

[21] Appl. No.: 974,382

[22] Filed: Dec. 29, 1978

[51] Int. Cl.³ .............................................. H02H 3/20
[52] U.S. Cl. ........................................ 361/56; 361/91; 361/18; 363/21
[58] Field of Search ...................... 363/20, 21; 361/90, 361/91, 56, 18; 307/237

[56] References Cited

U.S. PATENT DOCUMENTS

| 3,233,120 | 2/1966 | Darke | 307/237 X |
| 3,239,718 | 3/1966 | Fegley | 361/90 |
| 4,063,307 | 12/1977 | Stephens | 363/21 |
| 4,106,070 | 8/1978 | Gordon et al. | 361/42 |

Primary Examiner—Harry E. Moose, Jr.
Attorney, Agent, or Firm—Robert O. Nimtz

[57] ABSTRACT

A power converter circuit is disclosed utilizing pulse width modulation for power regulation. A rapid acting surge protection circuit for the power driving switch is operated from a string of zener diodes to disable the power switch. A base charge removal circuit is included for removing accumulated base charges on the driving transistor without the need for a bipolar driving signal for the power transistor.

5 Claims, 1 Drawing Figure

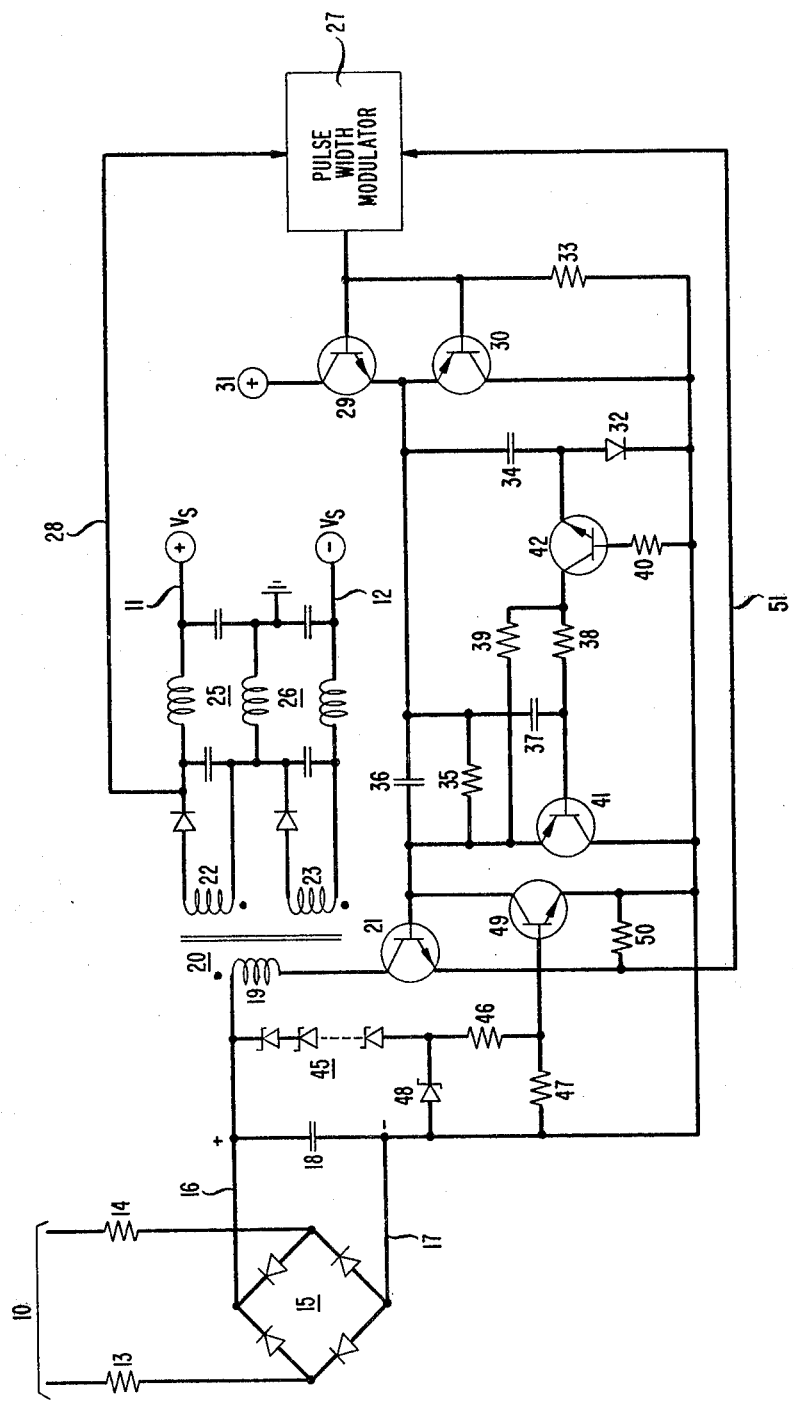

INPUT SURGE PROTECTION FOR CONVERTER CIRCUIT

BACKGROUND OF THE INVENTION

1. Field of the Invention

This invention relates to power supply circuits and, more particularly, to direct current voltage converters for providing direct current operating voltages from a direct current voltage source at a different voltage level.

2. Description of the Prior Art

It is common, particularly at remote locations, to generate operating voltages for electronic equipment by converting a locally available electrical supply to the proper current and voltage levels. In telephone carrier systems, for example, remote terminals, as well as intermediate repeaters, are often powered over the telephone line. One such system is shown in the copending application of B. S. Bosik, Ser. No. 974,381, filed Dec. 29, 1978, now U.S. Pat. No. 4,196,321.

In applications such as that described above, power for operating the power supply is made available as a high voltage direct current on the transmission line. Such transmission lines, however, are often exposed to the elements and subject to large voltage surges due to crosses with commercial power lines or to lightning strikes. Such power surges can damage the electronic components of the power converter itself, and can be transmitted through the power converter to damage the electronic circuits operated thereby.

It has been common to utilize gas tubes or other breakdown devices which, under the influence of such high voltages, break down and provide an easy conduction shunt path around the delicate electronic components. In many applications, however, such breakdown devices are not sufficiently rapid acting to prevent harm. Such power supplies, for example, normally utilize a transistor switch to interrupt the current flow through a transformer which provides the voltage conversion. This transistor switch is particularly susceptible to voltage surge damage because of its direct connection in the supply voltage path.

SUMMARY OF THE INVENTION

In accordance with the illustrative embodiment of the present invention, the input voltage to a power conversion circuit is monitored to detect surge voltages. In response to a surge voltage exceeding a predetermined threshold, a rapidly acting electronic circuit disables the transistor power switch, thereby protecting the switch itself, and the other circuit components, from the high voltage surge.

The advantage of the surge protection circuits of the present invention lies principally in the utilization of low power components to implement the protection function. These components may therefore be small in size and inexpensive, possibly fabricated in integrated circuit form.

BRIEF DESCRIPTION OF THE DRAWING

The single drawing is a detailed circuit diagram of a power converter circuit embodying the surge protection circuits in accordance with the present invention.

DETAILED DESCRIPTION

In the single FIGURE of the drawing there is shown a detailed circuit diagram of a power converter circuit utilizing voltages appearing on input lines 10 to generate control operating voltages for electronic equipment on output leads 11 and 12. Input leads 10 are connected through resistors 13 and 14 to a diode bridge circuit 15. Thus, the power on leads 10 can be either direct current or alternating current, or may comprise a direct current with an alternating current superimposed thereon. In any event, a direct current voltage appears between leads 16 and 17, polarized in a direction to make lead 16 positive and lead 17 negative. A capacitor 18 filters out the remaining alternating current component in the rectified signal.

Lead 16 is connected through primary winding 19 of transformer 20 to a transistor switch 21 having its collector-emitter path connected in series with winding 19 and emitter-current sense resistor 50. A pulse width modulated signal on the base of transistor 21 alternately enables and disables the collector-emitter path of transistor 21, causing energy first to be stored in the magnetic field of winding 19 and then to be delivered to the output via the secondary windings 22 and 23 of transformer 20. Additional filtering is provided by lowpass filter sections 25 and 26 to provide positive and negative operating voltages on leads 11 and 12, respectively. The voltage levels appearing on leads 11 and 12 are determined by the turns ratio of transformer 20 as well as by the waveform driving transistor 21.

Voltage regulation for the operating voltages on leads 11 and 12 are provided by means of a pulse width modulator 27 to which the outputs of windings 22 and 23 are connected by way of lead 28. Modulator 27 generates a rectangular signal the width of the pulses of which is controlled by signals on lead 28, from winding 20, and signals on lead 51, from the emitter of transistor 21. The output of modulator 27 is used to drive a complementary pair of transistors 29 and 30, the collector-emitter paths of which are connected between a positive voltage source 31 and an auxiliary negative voltage source 17. Resistor 33 provides the necessary base bias for transistors 29 and 30. The resulting signal at the common emitter connection of transistors 29 and 30 is supplied through an RC circuit including resistor 35 and capacitor 36 to the base of transistor 21. This signal is used to drive transistor 21 off and on in response to the pulse width modulated signal generated by modulator 27.

Since transistor 21 is used to switch relatively high current levels, base charges tend to accumulate in the base-emitter region of transistor 21 during the ON portion of its operating cycle. Attempts to turn transistor 21 off are therefore ineffectual until the accumulated base charges are removed. The base charge accumulation in transistor 21 therefore interferes with the precise timing of the switching action upon which regulation depends.

In order to rapidly dissipate accumulated base charges on transistor 21, a base charge removal circuit is provided comprising capacitors 34, 36 and 37, resistors 35, 38, 39 and 40, transistors 41 and 42 and diode 32. During positive excursions of the driving signal to the base of transistor 21, capacitor 37 is charged through a charging circuit including resistors 35, 38 and 39, and capacitor 34 is charged through the charging circuit of transistor 29 and diode 32. When the driving signal to the base of transistor 21 terminates, capacitor 37 immediately discharges through the base-emitter path of transistor 41. Transistor 41 is therefore immediately enabled to provide a rapid discharge path for the accumulated charge stored on the base of transistor 21. Resistor 38 provides an alternative long-term base current path for transistor 41 via transistor 42 and capacitor 34.

It can be seen that the base charge dissipation circuit provides a sink for base charges on transistor 21 which is enabled by positive driving pulses and which operates immediately following the termination of the driving pulse. This permits the removal of the base charge from transistor 21 without requiring the supply voltage more negative than source 17.

In accordance with the present invention, a string of zener diodes 45 is connected across capacitor 18. The input voltage for the power converter is therefore impressed across zener diodes 45. A pair of resistors 46 and 47 are connected as a voltage divider across zener diode 48 which is part of the zener diode string 45. When the voltage between leads 16 and 17 exceeds the combined breakdown voltages for zener diodes 45, a controlled voltage (determined by the breakdown voltage of zener diode 48) is impressed across the voltage divider comprising resistors 46 and 47. The midpoint of resistors 46 and 47 is connected to the base of transistor 49. When enabled, transistor 49 short circuits the base-emitter circuit of transistor 21, thereby disabling transistor 21.

It can be seen that, in the presence of a surge voltage on leads 10, string 45 breaks down to enable transistor 49 and thereby immediately disable switching transistor 21. The balance of the electronic circuitry connected to leads 11 and 12 is therefore protected from excessive voltages which might otherwise result from a large surge in the voltage on leads 10. The protector circuit consists of zener diode string 45, resistors 46 and 47 and transistor 49. Only the diode string 45 is exposed to the large voltage surges, while transistor 49 may be a small and inexpensive transistor since it is not exposed to any damaging voltages.

I claim:

1. A protection circuit for preventing excessive voltage from damaging a semiconductor switch exposed to said excessive voltages
    CHARACTERIZED BY
    a plurality of normally non-conductive voltage breakdown devices connected in series directly across a positive input lead and a negative input lead, and responsive to said excessive voltages to permit a current to flow through said breakdown devices,
    means including at least one of said breakdown devices for providing a control voltage in the presence of said excessive voltages, and
    means responsive to said control voltage for disabling said semiconductor switch,
    whereby said normally non-conductive devices limit the voltage between said input leads and simultaneously protect said semiconductor switch from damage due to said excessive voltages.

2. The protector circuit according to claim 1
    CHARACTERIZED IN THAT
    said breakdown devices comprise zener diodes.

3. The protector circuit according to claim 1
    CHARACTERIZED IN THAT
    said semiconductor switch includes the collector-emitter path of a first transistor, and
    said disabling means comprises the collector-emitter path of a second transistor connected across the base-emitter path of said first transistor.

4. A surge protection circuit for an electric power converter including a transformer and a transistor switch connected in series with the primary winding of said transformer and an input voltage supply, said protection circuit
    CHARACTERIZED BY
    at least two normally non-conductive voltage breakdown devices connected directly across said input voltage supply for limiting the input voltage to said transformer in order to protect circuitry connected to the output of said transformer,
    a bias circuit connected between said breakdown devices and enabled only when said breakdown devices are in their breakdown state, and
    a disabling circuit for said transistor switch responsive to the enablement of said bias circuit to disable said transistor switch.

5. A power converter circuit for electronic circuitry, said converter circuit utilizing semiconductor circuits to convert input power into operating voltage for said electronic circuitry, said converter
    CHARACTERIZED BY
    a breakdown voltage detector comprising a plurality of normally non-conductive devices connected directly across said input power supply for limiting the voltage across said input power supply to prevent damaging said converter circuit,
    voltage-controlled biasing means operated by said detector, and
    gating means, responsive to said biasing means, for disabling said converter circuit.

* * * * *

UNITED STATES PATENT AND TRADEMARK OFFICE
CERTIFICATE OF CORRECTION

PATENT NO. : 4,254,443
DATED : March 3, 1981
INVENTOR(S) : Thomas G. Wilson, Jr.

It is certified that error appears in the above—identified patent and that said Letters Patent is hereby corrected as shown below:

Column 2, line 33, after "rectangular" insert --wave--.

Signed and Sealed this

Thirteenth Day of October 1981

[SEAL]

Attest:

GERALD J. MOSSINGHOFF

Attesting Officer

Commissioner of Patents and Trademarks